United States Patent
Iida et al.

(10) Patent No.: US 11,630,270 B2
(45) Date of Patent: Apr. 18, 2023

(54) SEMICONDUCTOR DEVICE AND METHOD OF MANUFACTURING THE SAME

(71) Applicant: RENESAS ELECTRONICS CORPORATION, Tokyo (JP)

(72) Inventors: Tetsuya Iida, Tokyo (JP); Yasutaka Nakashiba, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 428 days.

(21) Appl. No.: 16/811,959

(22) Filed: Mar. 6, 2020

(65) Prior Publication Data

US 2020/0295530 A1 Sep. 17, 2020

(30) Foreign Application Priority Data

Mar. 11, 2019 (JP) .............................. JP2019-044062

(51) Int. Cl.
*G02B 6/42* (2006.01)

(52) U.S. Cl.
CPC ......... *G02B 6/4214* (2013.01); *G02B 6/4246* (2013.01)

(58) Field of Classification Search
CPC .................................. G02B 6/42; G02B 6/00
USPC .......................................................... 385/14
See application file for complete search history.

(56) References Cited

U.S. PATENT DOCUMENTS

| | | | | |
|---|---|---|---|---|
| 5,544,268 A * | 8/1996 | Bischel | .................. | G02F 1/377 385/16 |
| 5,757,989 A * | 5/1998 | Yoshimura | ............... | G02B 6/43 385/14 |
| 6,693,736 B1 * | 2/2004 | Yoshimura | .............. | G02F 1/313 385/9 |
| 8,691,584 B2 * | 4/2014 | Durack | .............. | G01N 33/5005 436/63 |
| 2002/0172464 A1 * | 11/2002 | Delwala | ............... | G02B 27/285 385/39 |
| 2003/0013304 A1 * | 1/2003 | Deliwala | .............. | G02B 6/1225 438/689 |
| 2003/0032286 A1 * | 2/2003 | Deliwala | ................ | B82Y 20/00 438/689 |
| 2004/0047539 A1 * | 3/2004 | Okubora | ................... | G02B 6/13 385/129 |
| 2004/0156589 A1 * | 8/2004 | Gunn, III | ........... | G02B 6/12004 385/37 |
| 2005/0213889 A1 * | 9/2005 | Blauvelt | ............ | G02B 6/12007 385/39 |
| 2010/0323297 A1 * | 12/2010 | Yanagisawa | ........... | H05K 1/113 430/315 |
| 2012/0183009 A1 * | 7/2012 | Adachi | ..................... | H01S 5/18 438/31 |

(Continued)

FOREIGN PATENT DOCUMENTS

JP H10507845 A * 7/1998
JP 3731542 B2 * 1/2006

(Continued)

*Primary Examiner* — Kaveh C Kianni
(74) *Attorney, Agent, or Firm* — McDermott Will & Emery LLP

(57) ABSTRACT

A semiconductor device includes a cladding layer and a first optical waveguide. The first optical waveguide is formed on the first cladding layer. An end surface of the first optical waveguide is inclined relative to a vertical line perpendicular to an upper surface of the cladding layer.

12 Claims, 28 Drawing Sheets

(56) References Cited

U.S. PATENT DOCUMENTS

| | | | | |
|---|---|---|---|---|
| 2013/0330049 | A1* | 12/2013 | Yanagisawa | G02B 6/4214 |
| | | | | 385/88 |
| 2014/0363120 | A1* | 12/2014 | Stephens | G02B 6/125 |
| | | | | 385/14 |
| 2018/0299706 | A1* | 10/2018 | Kuwabara | H01L 21/3065 |
| 2019/0391325 | A1* | 12/2019 | Iida | G02B 6/32 |
| 2022/0155537 | A1* | 5/2022 | Kobayashi | G02B 6/4214 |

FOREIGN PATENT DOCUMENTS

| | | | | | |
|---|---|---|---|---|---|
| JP | 2006171642 | A | * | 6/2006 | |
| JP | 4688248 | B2 | * | 5/2011 | G02B 6/12002 |
| JP | 2018-180332 | A | | 11/2018 | |
| KR | 20000029293 | A | * | 7/2012 | |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2019-044062 filed on Mar. 11, 2019 including the specification, drawings and abstract is incorporated herein by reference in its entirety.

BACKGROUND

The present disclosure relates to a semiconductor device and a method of manufacturing the semiconductor device, for example, the present disclosure relates to a semiconductor device including an optical waveguide and a method of manufacturing the semiconductor device.

There is a disclosed technique listed below.

[Patent Document 1] Japanese Unexamined Patent Application Publication No. 2018-180332

As an optical communication technique, a silicon photonics technique is known. For example, a semiconductor device employing a silicon photonics technique includes a grating coupler for outputting light from an optical waveguide or inputting light into the optical waveguide (see Patent Document 1). The grating coupler is an optical waveguide having an upper surface having convex/concave shapes (see FIG. 3 described later). For example, the grating coupler can emit light from the optical waveguide to the outside of the optical waveguide. The light emitted from the grating coupler enters an optical fiber disposed above the grating coupler.

SUMMARY

However, the light reaching the grating coupler is emitted not only above the grating coupler but also below the grating coupler. Therefore, when the optical fiber is disposed above the grating coupler, the light emitted below the grating coupler is lost. In the conventional semiconductor device, there is room for improvement from the viewpoint of enhancing the characteristics of the semiconductor device.

A problem of the present embodiments is improving of the characteristics of a semiconductor device. Other problems and novel features will become apparent from the description of the specification and drawings.

The semiconductor device according to embodiment includes a first optical waveguide formed on a cladding layer. An end surface of the first optical waveguide is inclined relative to a vertical line perpendicular to an upper surface of the cladding layer.

A method of manufacturing the semiconductor device according to embodiments includes processing an end portion of a first optical waveguide such that an end surface of the first optical waveguide is inclined relative to a vertical line perpendicular to an upper surface of a cladding insulating layer.

According to embodiments, the characteristics of the semiconductor device can be improved.

DETAILED DESCRIPTION

Figure 1:
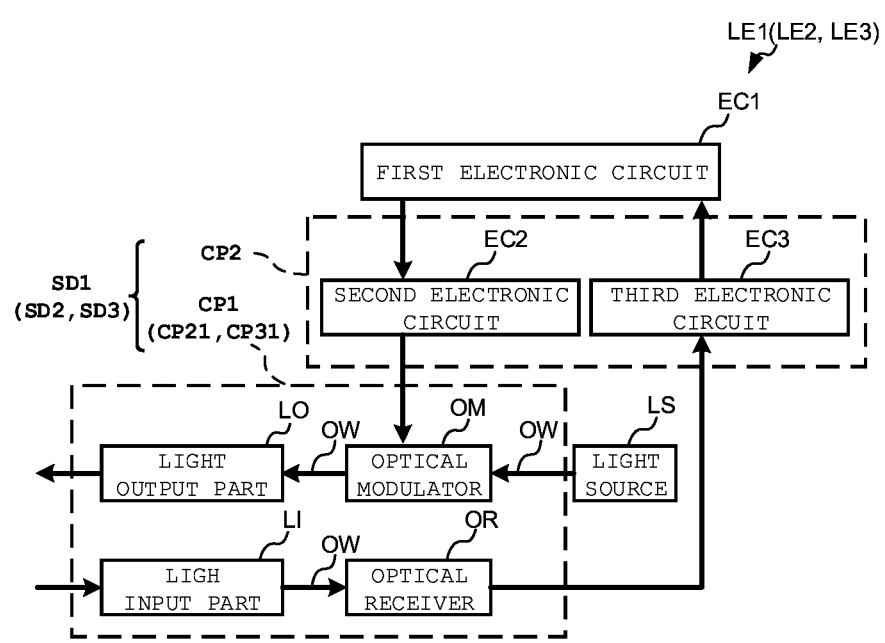
FIG. 1 is a block diagram showing an exemplary circuit configuration of an optoelectronic hybrid device according to first embodiment.

Hereinafter, a semiconductor device according to some embodiments will be described in detail by referring to the drawings. In the specification and the drawings, the same or corresponding elements are denoted by the same reference numerals, and a repetitive description thereof is omitted. In the drawings, for convenience of description, the configuration may be omitted or simplified. The cross-sectional view may be shown as an end view. At least a portion of each embodiment and each modification may be arbitrarily combined with each other.

First Embodiment

In a semiconductor device SD1 (see FIG. 2) according to a first embodiment, an end surface ES1 (see FIG. 2) of a first optical waveguide OW1 (see FIG. 2) reflects a light in the first optical waveguide OW1 downward. In the semiconductor device SD1 according to the first embodiment, a first semiconductor chip CP1 (see FIG. 2) including the first optical waveguide OW1 is laminated with a second semiconductor chip CP2 (see FIG. 2) including a transistor Tr (see FIG. 2).

(Circuit Configuration of the Optoelectronic Hybrid Device)

FIG. 1 is a block diagram showing an exemplary circuit configuration of the optoelectronic hybrid device LE1 according to the first embodiment.

As shown in FIG. 1, the optoelectronic hybrid device LE1 includes a first electronic circuit EC1, the semiconductor device SD1 and a light source LS. The semiconductor device SD1 according to the first embodiment includes the first semiconductor chip CP1 and the second semiconductor chip CP2. The first semiconductor chip CP1 includes an optical waveguide OW, an optical modulator OM, a light output part LO, a light input part LI, and an optical receiver OR. The second semiconductor chip CP2 includes a second electronic circuit EC2 and a third electronic circuit EC3. The semiconductor device SD1 will be described later in detail.

The first electronic circuit EC1 outputs an electric signal for controlling the second electronic circuit EC2 and the third electronic circuit EC3, respectively. The first electronic circuit EC1 receives an electric signal outputted from the third electronic circuit EC3. The first electronic circuit EC1 is electrically coupled with the second electronic circuit EC2 and the third electronic circuit EC3. The first electronic circuit EC1 is formed of, for example, a known Central Processing Unit (CPU) or Field-Programmable gate array (FPGA) which includes a control circuit and a storage circuit.

The light source LS emits light. Examples of the type of light source LS include a laser diode LD. A wavelength of the light emitted from the light source LS may be set as appropriate in accordance with the material constituting the optical waveguide OW as long as the emitted light can pass through the inside of the optical waveguide OW. For example, the peak wavelength of the light emitted from the light source LS is 1.0 μm or more and 1.6 μm or less. The light source LS is optically connected to the optical modulator OM via the optical waveguide OW.

The second electronic circuit EC2 outputs an electric signal (control signal) for controlling the operation of the optical modulator OM. More specifically, the second electronic circuit EC2 controls the optical modulator OM based on the control signal received from the first electronic circuit EC1. The second electronic circuit EC2 is electrically coupled with the optical modulator OM. The second electronic circuit EC2 is constituted by, for example, a well-known transceiver IC including a control circuit.

The optical modulator OM modulates the phase of the light emitted from the light source LS based on the control signal received from the second electronic circuit EC2. The optical modulator OM generates an optical signal including information included in the control signal. Examples of the type of the optical modulator OM include a Mach-Zehnder type light optical modulator and a ring type optical modulator. The optical modulator OM may be an electrically controlled optical modulator, a thermally controlled optical modulator, or a combined optical modulator using both electrical control and thermal control. The optical modulator OM is optically connected to the light output part LO via the optical waveguide OW.

The light output part LO outputs the optical signal modulated by the optical modulator OM to the outside of the semiconductor device SD1. For example, the light output part LO emits an optical signal toward an external optical fiber. The detail of the light output part LO will be described later.

The light input part LI inputs external light into the semiconductor device SD1. For example, optical signal emitted from external optical fibers are inputted into the semiconductor device SD1. The optical input part LI is optically connected with the optical receiver OR via the optical waveguide OW. The light input part LI is formed of the same material as the optical waveguide OW.

The optical receiver OR generates electron-hole pairs based on the optical signal received from the light input part LI. The optical receiver OR converts an optical signal into an electric signal. The optical receiver OR may have photoelectric conversion characteristics. Examples of the type of the optical receiver OR include an avalanche photodiode type optical receiver. The optical receiver OR is electrically coupled with the third electronic circuit EC3.

The third electronic circuit EC3 processes the electrical signal received from the optical receiver OR and outputs the processed electrical signal to the first electronic circuit EC1. More specifically, the third electronic circuit EC3 amplifies the electric signal received from the optical receiver OR and outputs the amplified electrical signal to the first electronic circuit EC1. The third electronic circuit EC 3 is constituted by, for example, a known receiver integrated circuit (IC) including amplifier circuit.

Next, an exemplary operation of the optoelectronic hybrid device LE1 according to the first embodiment will be described.

First, the transmitting part of the optoelectronic hybrid device LE1 will be described. The light emitted from the light source LS reaches the optical modulator OM via the optical waveguide OW. The second electronic circuit EC2 controls the operation of the optical modulator LM based on the control signal received from the first electronic circuit EC1, and modulates the light reaching the optical modulator OM. As a result, the electric signal is converted into an optical signal. The optical signal reaches the light output part LO via the optical waveguide OW, and the optical signal is output to the outside of the semiconductor device SD1 in the light output part LO. The optical signal outputted from the semiconductor device SD1 is guided to another semiconductor device via optical fibers or the like.

Next, the receiving part of the optoelectronic hybrid device LE1 will be described. An optical signal guided from another semiconductor device through an optical fiber or the like reaches the light input part LI. The optical signal is guided to the inside of the optical waveguide OW in the light input part LI. The optical signal reaches the optical receiver OR via the optical waveguide OW, and is converted into an electric signal. The electric signal is processed by the third electronic circuit EC3 and then transmitted to the first electronic circuit EC1.

(Configuration of the Semiconductor Device)

Figure 2:
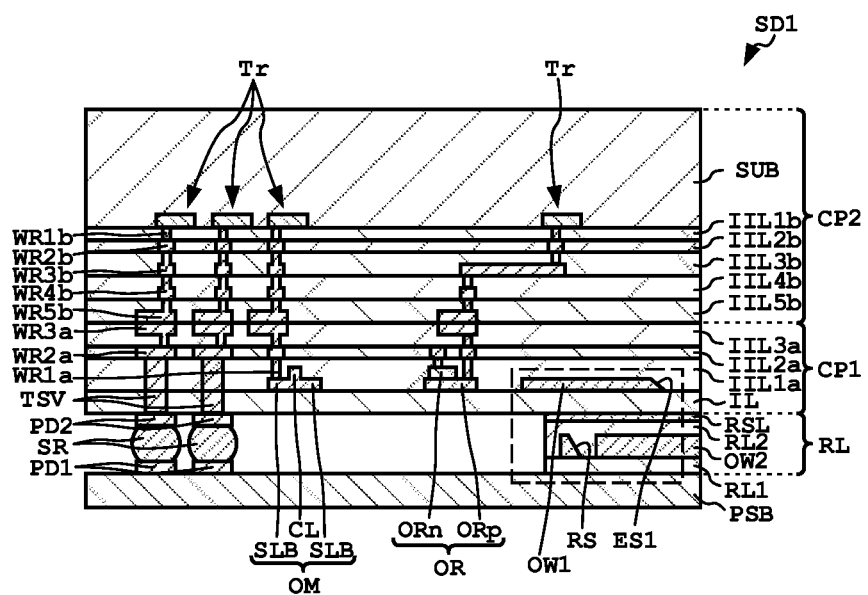
FIG. 2 is a cross-sectional view showing a main portion of the semiconductor device according to the first embodiment.

Next, a configuration of the semiconductor device SD1 according to the first embodiment will be described. FIG. 2 is a cross-sectional view showing a main portion of the semiconductor device SD1.

As shown in FIG. 2, the semiconductor device SD1 includes (1) a printed substrate PSB, (2) a first semiconductor chip CP1, (3) a second semiconductor chip CP2, and (4) a resin layer RL.

(1) Printed Substrate PSB

The printed substrate PSB supports the resin layer RL, the first semiconductor chip CP1, and the second semiconductor chip CP2. A first pad PD1 is formed on the surface of the printed substrate PSB. Although not shown in particular, the first electronic circuit EC1 is mounted on the print substrate PSB. As the configuration of the printed substrate PSB and the first pad PD1, a known configuration employed in the semiconductor technology can be employed.

(2) First Semiconductor Chip CP1

The first semiconductor chip CP1 is disposed on the printed substrate PSB via the resin layer RL interposed therebetween. As shown in FIG. 2, the first semiconductor chip CP1 includes an insulating layer IL, a first optical waveguide OW1, an optical modulator OM, an optical receiver OR, a second pad PD2, a first multilayer wiring layer, and a through electrode TSV. The first multilayer wiring layer includes interlayer insulating layers IIL1$a$, IIL2$a$, and IIL3$a$, wirings WR1$a$, WR2$a$, and WR3$a$, and the through electrode TSV. A reflective surface RS and a second optical waveguide OW2 are formed in the resin layer RL.

The insulating layer IL supports the first optical waveguide OW1, the optical modulator OM and the optical receiver OR. The insulating layer IL is a first cladding layer for substantially confining light propagating through the first optical waveguide OW1 to the inside of the first optical waveguide OW1. A material of the insulating layer IL has a refractive index that is less than a refractive index of a material of the first optical waveguide OW1. The insulating layer IL are formed of, for example, silicon oxide ($SiO_2$). The refractive index of the material of insulating layer IL is, for example, 1.46. In this specification, the refractive index is a numerical value for light having a wavelength of 1.5 µm.

An upper surface of the insulating layer IL may contain an impurity for adjusting the refractive index. Examples of impurities for refractive index adjustment include titanium oxide, germanium oxide, phosphorus oxide, ytterbium oxide, and aluminum oxide. The impurity concentration is appropriately adjusted in accordance with the type of the impurity, and can be adjusted so that the refractive index at the upper surface of the insulating layer IL is about 2.0. By introducing the impurity for adjusting the refractive index, the refractive index differences at a boundary between the first optical waveguide OW1 (refractive index: 3.5) and the insulating layer IL (refractive index: 1.46) can be reduced. Thereby, it is possible to suppress the reflection light from the end surface ES1 of the first optical waveguide OW1, which will be described later, from being reflected at the boundary between the lower surface of the first optical waveguide OW1 and the upper surface of the insulating layer IL.

It is preferable that a thickness of the insulating layer IL is greater than a seepage distance of the light from the first optical waveguide OW1. From the viewpoint of reducing stress applied to the semiconductor device SD1 and from the viewpoint of suppressing sticking of the semiconductor wafer by the electrostatic chuck when manufacturing the semiconductor device SD1, the thickness of the insulating layer IL is preferable small. For example, the thickness of the first insulating layer IL1 is 1 µm or more, and 3 µm or less.

The first optical waveguide OW1 is a path through which light can propagate (travel). The first optical waveguide OW1 is formed on the insulating layer IL. For example, the first optical waveguide OW1 has a width of 300 nm or more, and 500 nm or less, and a thickness of 200 nm or more, and 300 nm or less. The cross-sectional shape of the first optical waveguide OW1 is a rectangular shape or a trapezoidal shape. As described above, examples of the material of the first optical waveguide OW1 include silicon (Si) and germanium (Ge). Examples of crystal structures of the material of the first optical waveguide OW1 include single crystal and polycrystalline. From the viewpoint of reducing light propagating losses in the optical element, the crystal structure of the material of the first optical waveguide OW1 is preferably single crystal.

The end face ES1 of the first optical waveguide OW1 is inclined relative to a vertical line perpendicular to an upper surface of the insulating layer IL. The end surface ES1 of the first optical waveguide OW1 is an end surface that connects an upper surface, a lower surface, and both side surfaces of the first optical waveguide OW1 with each other at the end portion of the first optical waveguide OW1. The end portion of the first optical waveguide OW1 is a portion functioning as a light output part LO or a light input part LI in the first optical waveguide OW1.

An angle formed by the lower surface of the first optical waveguide OW1 and the end surface ES1 is smaller than an angle formed by the lower surface and the side surface of the first optical waveguide OW1. Thus, the end surface ES1 of the first optical waveguide OW1 can reflect the light reaching the end portion of the first optical waveguide OW1 downward. In other words, the end surface ES1 of the first optical waveguide OW1 can reflect the light reaching the end portion of the first optical waveguide OW1 toward the insulating layer IL-side. The angle formed by the lower surface of the first optical waveguide OW1 and the end surface ES1 is more than 0°, and less than 90°, and the angle is preferably 35° or more, and 55° or less.

The crystallographic plane of the end face ES1 is not particularly limited, and can be appropriately adjusted in accordance with a forming method of the end face ES1. The crystallographic plane of the end face ES1 is, for example, a (111) plane. The crystallographic plane of the upper surface of the first optical waveguide OW1 is a (100) plane.

The width of the end portion (end surface) of the first optical waveguide OW1 may be the same as or different from the width of a portion of the first optical waveguide OW1 other than the end portion. The width of the end portion of the first optical waveguide OW1 may be smaller or greater than the width of a portion of the first optical waveguide OW1 other than the end portion. In the first embodiment, the width of the end portion of the first optical waveguide OW1 is substantially the same as the width of the portion of the first optical waveguide OW1 other than the end portion. Here, the width of the first optical waveguide OW1 is a distance between both sides of the first optical waveguide OW1 in an opposing direction in which both sides oppose each other.

The optical modulator OM is a Mach-Zehnder type optical modulator for changing the phase of light traveling inside the optical modulator OM. The optical modulator OM is formed on the insulating layer IL. As a structure of the optical modulator OM, a structure known as an optical modulator in the silicon photonics art can be adopted. In the first embodiment, the optical modulator OM includes a core layer CL including an optical waveguide OW, and a pair of slab portion SLB formed such that the pair of slab portion SLB sandwich the core layer CL. Examples of a material for optical modulator OM are similar to the material for the first optical waveguide OW1. Further, a predetermined impurity may be implanted into one or both of the core layer CL and the slab portion layer SLB.

The optical receiver OR is an optical device having a photoelectric converting function. The optical receiver OR converts the received optical signal into an electrical signal. As the configuration of the optical receiver OR, a known configuration adopted as an optical receiver in silicon photonics can be appropriately adopted. Examples of types of optical receiver OR include pn-type optical receiver and pin-type optical receiver. In first embodiment, the optical receiver OR is a pn-type optical receiver. The optical receiver OR includes a p-type semiconductor portion ORp and an n-type semiconductor portion ORn formed on the p-type semiconductor portion ORp.

The second pad PD2 is formed on a back surface of the insulating layer IL. The second pad PD2 is electrically coupled with the first pad PD1 via a solder ball SR. As the structure of the second pad PD2, a known structure adopted in the semiconductors can be adopted.

The first multilayer wiring layer is a layer composed of two or more wiring layers. The first multilayer wiring layer is formed on the insulating layer. The wiring layer is a layer including an interlayer insulating layer and one or both of a wiring and via (also referred to as "plug") formed in the interlayer insulating layer. The via is a conductive member that electrically connects two wiring formed in layers that differ from each other.

The first multilayer wiring layer includes an interlayer insulating layers IIL1a, IIL2a, and IIL3a and wirings WR1a, WR2a, and WR3a. The configuration of the interlayer insulating layers IIL1a, IIL2a, and IIL3a and the wirings WR1a, WR2a, and WR3a may be well known in the art. The material of the interlayer insulating layers IIL1a and IIL2a, and IIL3a are, for example, silicon oxide ($SiO_2$) having a refractive index of 1.46. Examples of material of the wirings WR1a, WR2a, and WR3a include tungsten (W), aluminum (Al), and copper (Cu).

The interlayer insulating layer IIL1a is formed on the insulating layer IL such that the interlayer insulating layer IIL1a covers the first optical waveguide OW1, the optical modulator OM and the optical receiver OR. The interlayer insulating layer IIL1a is a second cladding layer for substantially confining the light propagating through the first optical waveguide OW1 to the inside of the first optical waveguide OW1. The thickness of the interlayer insulating layer IIL1a is preferably 1 μm or more, and 5 μm or less, and more preferably 2 μm or more, and 3 μm or more from the viewpoint of suppressing scattering of light seeped from the first optical waveguide OW1 by the wiring WR2a formed on the interlayer insulating layer IIL1a.

The wiring WR1a is formed in the interlayer insulating layer IIL1a. The interlayer insulating layer IIL2a is formed on the interlayer insulating layer IIL1a. The wiring WR2a is formed in the interlayer insulating layer IIL2a. The interlayer insulating layer IIL3a is formed on the interlayer insulating layer IIL2a. The wiring WR3a is formed in the interlayer insulating layer IIL3a. A thickness of each of the interlayer insulating layer IIL2a and the interlayer insulating layer IIL3a is, for example, 0.8 μm or more, and 1.2 μm or less.

The through electrode TSV penetrates the insulating layer IL and the interlayer insulating layer IIL1a in the thickness direction of the first multilayer wiring layer. The through electrode TSV electrically couples the first pad PD1 and the wiring WR2a with each other. As the structure of the through electrode TSV, a known structure adopted in the semiconductor technology can be adopted. Examples of the material of the through electrode TSV include tungsten (W), aluminum (Al), and copper (Cu).

(3) Second Semiconductor Chip CP2

The second semiconductor chip CP2 is disposed on the first semiconductor chip CP1. As shown in FIG. 2, the second semiconductor chip CP2 includes a semiconductor substrate SUB, a transistor Tr, and a second multilayer wiring layer.

The second multilayer wiring layer includes an interlayer insulating layers IIL1b, IIL2b, IIL3b, IIL4b, and IIL5b and wirings WR1b, WR2b, WR3b, WR4b, and WR5b. The second semiconductor chip CP2 is laminated with the first semiconductor chip CP1 such that the wiring WR3a and the wiring WR5b are directly contacted with each other. As a result, the first semiconductor chip CP1 and the second semiconductor chip CP2 are laminated with each other with strength.

The semiconductor substrate SUB supports the second multilayer wiring layer. Although not shown in particular, the second electronic circuit EC2 (see FIG. 1) and the third electronic circuit EC3 (see FIG. 1) are formed on a main surface of the semiconductor substrate SUB. The transistor Tr constituting the second electronic circuit EC2 and the third electronic circuit EC3 is formed on the semiconductor substrate SUB. As the structure of the transistor Tr, a structure known as a transistor in the semiconductor technology can be adopted. Examples of the transistor Tr include a FinFET and a planar FET. The transistor Tr is electrically coupled with each of the optical modulator OM and the optical receiver OR via the wiring in the first multilayer wiring layer and the wiring in the second multilayer wiring layer.

The material constituting the semiconductor substrate SUB is, for example, silicone. The semiconductor substrate SUB is, for example, a monocrystalline silicon substrate containing an impurity such as boron (B) and phosphorus (P).

The second multilayer wiring layer includes an interlayer insulating layers IIL1b, IIL2b, IIL3b, IIL4b, and IIL5b and wirings WR1b, WR2b, WR3b, WR4b, and WR5b. Examples of the configurations of the interlayer insulating layer IIL1b, the IIL2b, IIL3b, IIL4b, IIL5b and the wirings WR1b, WR2b, WR3b, WR4b, and WR5b are similar to those of the first multilayer wiring layer.

The interlayer insulating layer IIL1b is formed on the semiconductor substrate SUB such that the interlayer insulating layer IIL1b covers the transistor Tr. The wiring WR1b is formed in the interlayer insulating layer IIL1b. As shown in FIG. 2, the interlayer insulating layer IIL2b, IIL3b, IIL4b, IIL5b is formed on the interlayer insulating layer IIL1b. The wirings WR1b, WR2b, WR3b, WR4b, and WR5b are formed in the interlayer insulating layers IIL1b and the IIL2b, IIL3b, IIL4b, and IIL5b, respectively.

(4) Resin Layer RL

The resin layer RL is formed between the printed substrate PSB and the insulating layer IL. The resin layer RL includes a first resin layer RL1, a reflective surface RS, a second optical waveguide OW2, a second resin layer RL2, and a reflection suppressing layer RSL.

The first resin layer RL1 is a third cladding layer for substantially confining the light propagating through the second optical waveguide OW2 to the inside of the second optical waveguide OW2. A refractive index of a material of the first resin layer RL1 is smaller than a refractive index of a material of the second optical waveguide OW2. The material of the first resin layer RL1 is, for example, a fluorinated polyimide compound. The refractive index of the first resin layer RL1 is, for example, 1.5. A thickness of the first resin layer RL1 is, for example, 3 μm or more, and 50 μm or less.

The reflective surface RS reflects the light reflected by the end surface ES1 of the first optical waveguide OW1 toward the second optical waveguide OW2. The reflective surface RS is formed on the surface of the substrate. The substrate is a resin layer formed in the same layer as the second optical waveguide OW2. Examples of a material for the reflective surface RS include metals such as aluminum (Al), gold (Au), silver (Ag), polymer, and inorganic-organic mixtures.

The second optical waveguide OW2 is a path through which light can propagate (travel). In the first embodiment, the second optical waveguide OW2 propagates the light reflected by the reflective surface RS after being reflected by the end surface ES1 of the first optical waveguide OW1. The second optical waveguide OW2 is formed on the first resin layer EL1. For example, the second optical waveguide OW2 has width of 3 μm or more, and 50 μm or less, a thickness of 3 μm or more, and 50 μm or less. The cross-sectional shape of the second optical waveguide OW2 is a rectangular shape, a trapezoidal shape, or a circular shape.

Examples of a material for the second optical waveguide OW2 include resin. Examples of such resin include polyimide compound such as fluorine polyimide, deuterated silicone resins and inorganic-organic composite resin. A refractive index of the material of the second optical waveguide OW2 is, for example, 1.3 or more, and 1.8 or less.

The second resin layer RL2 is a fourth cladding layer for substantially confining the light propagating through the second optical waveguide OW2 to the inside of the second optical waveguide OW2. A refractive index of the material of the second resin layer RL2 is smaller than a refractive index of the material of the second optical waveguide OW2. From the viewpoint of suppressing light reflection at the boundary between the second resin layer RL2 and the insulating layer IL, it is preferable that the difference between the refractive index of the material of the second resin layer RL2 and the refractive index of the material of the insulating layer IL be small. For example, the difference is preferably 0.05 or less. Examples of a thickness and a material of the second resin layer RL2 are similar to those of the first resin layer RL1. The thickness of the second resin layer RL2 is, for example, 3 μm or more, and 30 μm or less.

The reflection suppressing layer RSL suppresses reflection of light reflected by the end surface ES1 of the first optical waveguide OW1 at the boundary between the insulating layer IL and the resin layer RL when the light enters the resin layer RL from the insulating layer IL. Examples of a material for the reflection suppressing layer RSL include amorphous fluororesin, magnesium fluoride, refractive-index-adjusted $SiO_2$, and polyethylene terephthalate (PET) compound.

Here, an optical path in the semiconductor device SD1 according to the first embodiment will be described. More specifically, the optical path of the light emitted to the outside of the semiconductor device SD1 in the light output part LO of the semiconductor device SD1 will be described. The light output part LO of the semiconductor device SD1 according to the first embodiment is mainly constituted by the end surface ES1 of the first optical waveguide OW1, the reflective surface RS, and the second optical waveguide OW2.

Figure 3:
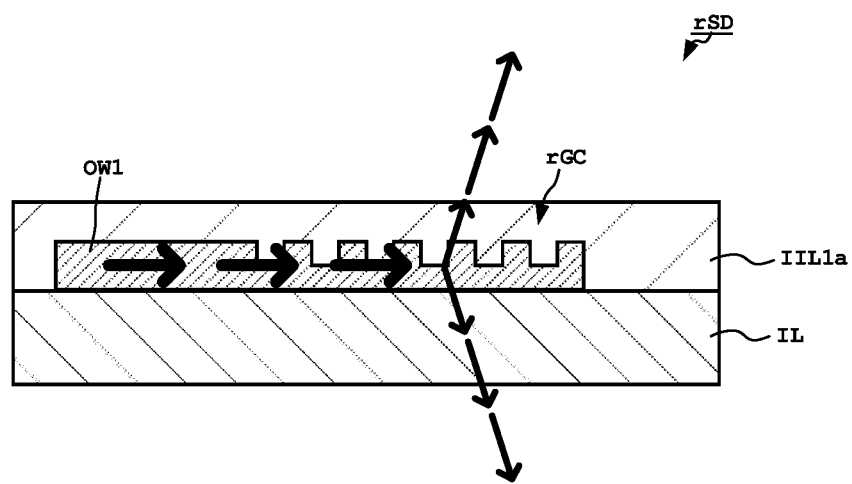
FIG. 3 is a cross-sectional view showing an optical path in a light output part of a comparative semiconductor device.
Figure 4:
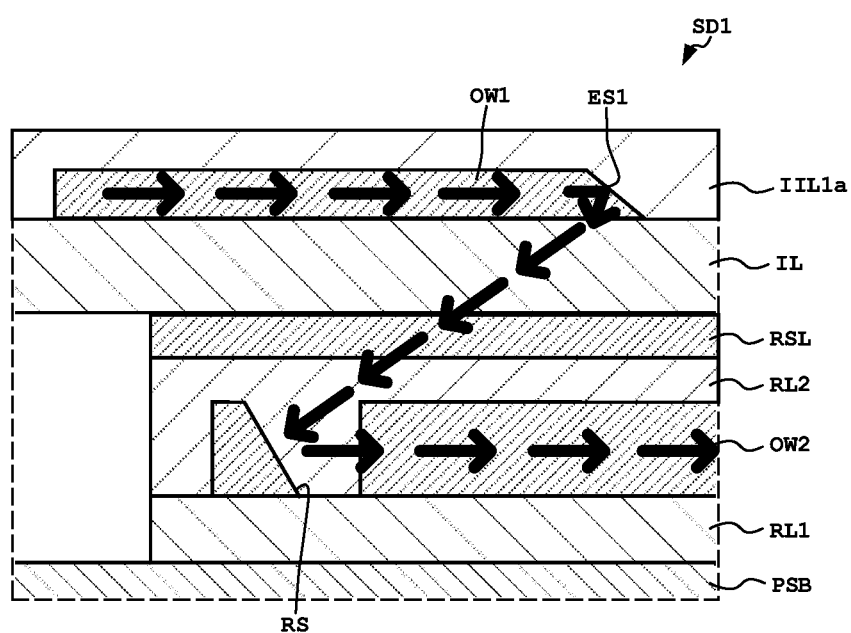
FIG. 4 is a cross-sectional view showing an optical path in the light output part of the semiconductor device according to the first embodiment.

For comparison, as a light output part, an optical path in a semiconductor device rSD (hereinafter also referred to as "comparative semiconductor device rSD") including a grating coupler rGC will also be described. FIG. 3 is a cross-sectional view showing an optical path in the light output part of a comparative semiconductor device rSD. FIG. 4 is a cross-sectional view showing an optical path in the light output part LO of the semiconductor device SD1 according to the first embodiment. FIG. 4 is an enlarged cross-sectional view showing an area surrounded by a broken line in FIG. 2. In FIGS. 3 and 4, arrows indicate the traveling direction of light, and the thickness of the arrows indicates the amount of light.

As shown in FIG. 3, in the comparative semiconductor device rSD, the light reaching the grating coupler rGC is emitted to the outside of the first optical waveguide OW1 toward an upper side and a lower side of the grating coupler rGC, respectively. In this instance, the amount of light emitted above the grating coupler rGC and the amount of light emitted below the grating coupler rGC are determined according to the shape and size of the concavo-convex structure constituting the grating coupler rGC. FIG. 3 shows a case where the amount of light emitted upward and the amount of light emitted downward are equal to each other. In the case where the light emitted upward of the grating coupler rGC is received by the optical fiber, the light emitted downward of the grating coupler rGC is lost.

On the other hand, in the semiconductor device SD1 according to the first embodiment, as shown in FIG. 4, the light reaching the end surface ES1 of the first optical waveguide OW1 is reflected toward the reflective surface RS. The reflected light from the end surface ES1 is emitted to the outside of the first optical waveguide OW1 on the lower surface of the first optical waveguide OW1, passes through the insulating layer IL and the second resin layer RL2, and reaches the reflective surface RS. The light reflected by the reflective surface RS enters the interior of the second optical waveguide OW2 at an end surface of the second optical waveguide OW2. Light propagating in the second optical waveguide OW2 is guided to external optical fibers by the second optical waveguide OW2. As described above, in the semiconductor device SD1 according to the first embodiment, the light is guided to the outside of the semiconductor device SD1 by reflection. Therefore, in the semiconductor device SD1 according to the first embodiment, light can be outputted to the outside while suppressing light losses as compared with the comparative semiconductor device rSD.

(Method of the Semiconductor Device)

Next, an exemplary method of manufacturing the semiconductor device SD1 according to the first embodiment will be described. FIG. 5 to FIG. 17 are cross-sectional views showing exemplary steps included in the method of manufacturing the semiconductor device SD1.

The method of manufacturing the semiconductor device SD according to the first embodiment includes (1) a manufacturing the first semiconductor wafer SW1 (see FIG. 10), (2) a manufacturing the second semiconductor wafer SW2 (see FIG. 11), (3) a forming the resin layer RL (see FIG. 16), and (4) an assembling.

(1) Manufacturing the First Semiconductor Wafer SW1

First, the first semiconductor wafer SW1 is manufactured. The manufacturing the first semiconductor wafer SW1 includes (1-1) providing a wafer SW (see FIG. 5), (1-2) forming the optical elements, (1-3) forming the end portion of the first optical waveguide OW1 (see FIG. 7), (1-4) forming the first multilayer wiring layer, (1-5) removing a semiconductor substrate SS (see FIG. 8), and (1-6) forming the through electrode TSV (see FIG. 10) and the second pad PD2 (see FIG. 10).

(1-1) Providing the Wafer SW

Figure 5:
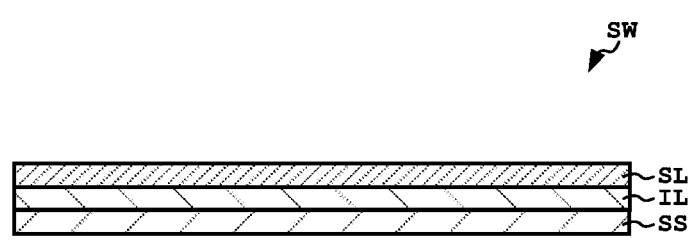
FIG. 5 is a cross-sectional view showing an exemplary step included in a method of manufacturing the semiconductor device according to the first embodiment.

First, as shown in FIG. 5, the wafer SW including the semiconductor substrate SS, the insulating layer IL formed on the semiconductor substrate SS, and semiconductor layer SL formed on the insulating layer IL is prepared.

The wafer SW may be manufactured or purchased as a commercial product. The wafer SW is, for example, a Silicon On Insulator (SOI) substrate. A method of manufacturing the SOI substrate can be appropriately selected from a known manufacturing method. Example of the method of manufacturing the SOI substrate includes Separation by Implantation of Oxygen (SIMOX) method and smart-cut method.

The material of the semiconductor substrate SS is, for example, silicone. The plane orientation of a main surface of the semiconductor substrate SS is (100), and a resistivity of the semiconductor substrate SS is 5 Ω·cm or more, and 50 Ω·cm or less. A thickness of the semiconductor substrate SS is, for example, 100 μm or more, and 900 μm or less.

(1-2) Forming the Optical Elements

Figure 6:
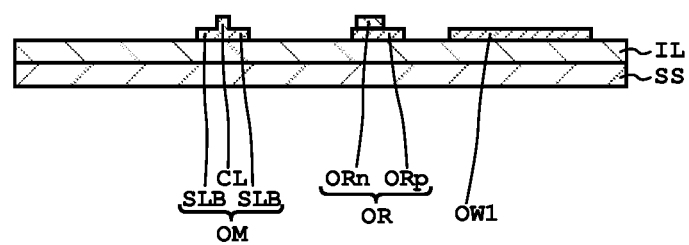
FIG. 6 is a cross-sectional view showing an exemplary step included in the method of manufacturing the semiconductor device according to the first embodiment.

Next, as shown in FIG. 6, the optical elements such as the first optical waveguide OW1, the optical modulator OM and the optical receiver OR are formed on the insulating layer IL. Specifically, first, the semiconductor layer SL is patterned. The patterning of the semiconductor layer SL can be performed by photolithography and etching method. Next, the optical modulator OM is formed by implanting a predetermined impurity into the semiconductor layer SL constituting the optical modulator OM. After the p-type semiconductor portion ORp is formed by implanting a p-type impurity into the semiconductor layers SL constituting the optical receiver OR, the n-type semiconductor portion ORn is formed on the p-type semiconductor portion ORp by the epitaxial growth method and the ion implantation method. Thereby, the first optical waveguide OW1, the optical modulator OM and the optical receiver OR can be formed on the insulating layer IL.

(1-3) Processing the End Portion of the First Optical Waveguide OW1

Figure 7:
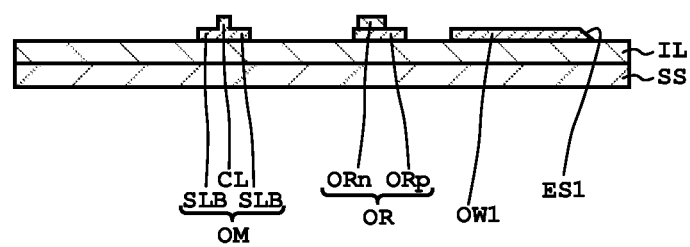
FIG. 7 is a cross-sectional view showing an exemplary step included in the method of manufacturing the semiconductor device according to the first embodiment.

Next, as shown in FIG. 7, the end portion of the first optical waveguide OW1 is processed so that the end surface ES1 of the first optical waveguide OP1 is inclined relative to the vertical line perpendicular to the upper surface of the insulating layer IL. For example, the end portion of the first optical waveguide OW1 may be processed by a wet etching method or may be processed by a dry etching method.

When the end portion of the first optical waveguide OW1 is processed by a wet etching method, the end portion of the first optical waveguide OW1 is processed with an etchant while the portion other than the end portion of the first optical waveguide OW1 is covered with a mask. The mask is formed of, for example, silicon oxide ($SiO_2$). The crystallographic plane of the end face ES1 after processing is the (111) plane. This is because the etching rate differs depending on the crystal orientation of the semiconductor layer SL.

Examples of method for the end portion of the first optical waveguide OW1 include dry etching method and wet etching method. Examples of an etchant used in the wet etching method include aqueous potassium hydroxide (KOH), aqueous tetramethylammonium hydroxide (TMAH), aqueous ethylene diamine pyrocatechol (EDP), aqueous hydrazine (N2H), aqueous sodium hydroxide, and aqueous cesium hydroxide (CsOH).

When the end portion of the first optical waveguide OW1 is processed by a dry etching method, the end portion of the first optical waveguide OW1 is etched while covering the end portion of the first optical waveguide OW1 with a resist mask having an inclined surface. As a result, the end surface ES1 of the first optical waveguide OW1 having a shape corresponding to the shape of the inclined surface of the resist mask is formed.

Figure 8:
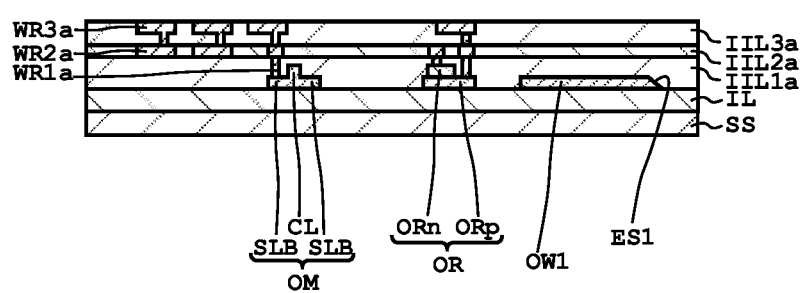
FIG. 8 is a cross-sectional view showing an exemplary step included in the method of manufacturing the semiconductor device according to the first embodiment.

Next, as shown in FIG. 8, the first multilayer wiring layer is formed on the insulating layer IL. The forming the first multilayer wiring layer includes, for example, forming interlayer insulating layer IIL1a, IIL2a, IIL3a, and wiring WR1a, WR2a, WR3a, respectively. The first multilayer wiring layer may be formed in the same manner as a method known as a method of forming a multilayer wiring layer in the semiconductor technology.

(1-5) Removing the Semiconductor Substrate SS

Figure 9:
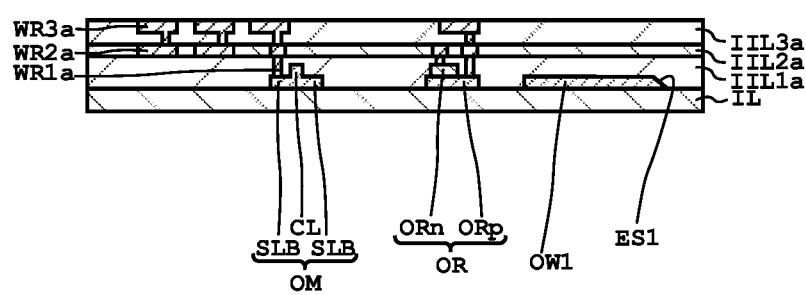
FIG. 9 is a cross-sectional view showing an exemplary step included in the method of manufacturing the semiconductor device according to the first embodiment.

Next, as shown in FIG. 9, all or a portion of the semiconductor substrate SS is removed. In the first embodiment, all of the semiconductor substrate SS is removed. The method of removing the semiconductor substrate SS is, for example, a grinding method.

(1-6) Forming the Through Electrode TSV and the Second Pad PD2

Figure 10:
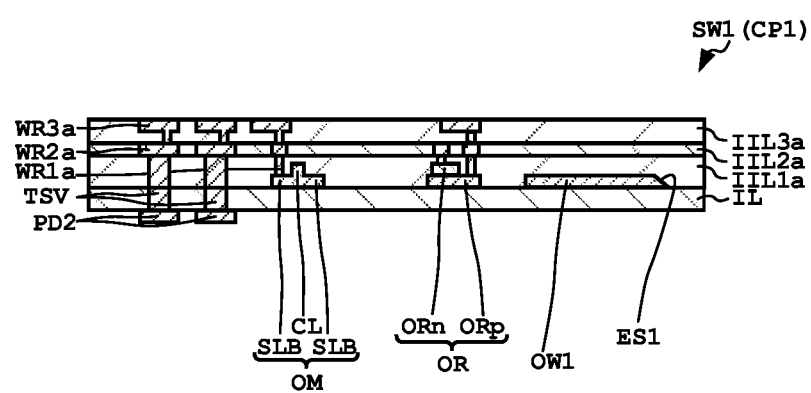
FIG. 10 is a cross-sectional view showing an exemplary step included in the method of manufacturing the semiconductor device according to the first embodiment.

Next, as shown in FIG. 10, the through electrode TSV penetrating through the interlayer insulating layer IIL1a, IIL2a, IIL3a, and insulating layer IL is formed, and then the second pad PD2 is formed on the through electrode TSV. For example, the through electrode TSV may be formed by forming a through-hole reaching the wiring WR2a is formed in the interlayer wiring layer IIL1a, IIL2a, IIL3a and insulating layer IL, and then the through-hole is filled with a conductive film. The method of forming the through holes is, for example, a dry etching method. The method of forming the conductive film is, for example, a sputtering method.

The second pad PD2 may be formed, for example, by forming a conductive film on the back surface of the insulating layer IL and then patterning the conductive film. The method of forming the conductive film is, for example, a sputtering method. The patterning method of the conductive film is, for example, a dry etching method.

Through the above steps, the first semiconductor chip SW1 including the plurality of first semiconductor chips CP1 can be manufactured.

(2) Manufacturing the Second Semiconductor Wafer SW2

Figure 11:
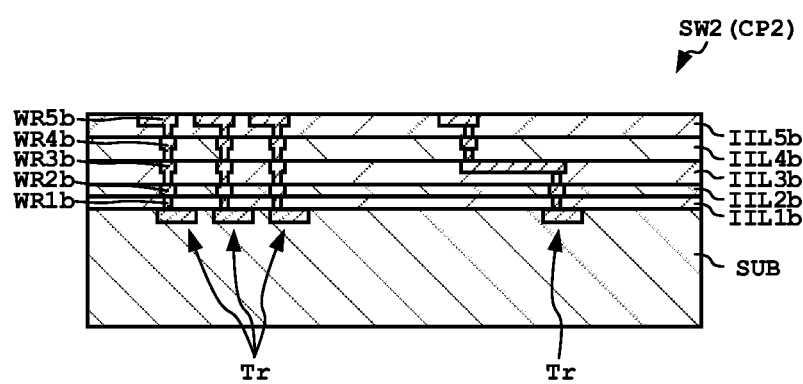
FIG. 11 is a cross-sectional view showing an exemplary step included in the method of manufacturing the semiconductor device according to the first embodiment.

Next, as shown in FIG. 11, the second semiconductor wafer SW2 is manufactured. The second semiconductor wafer SW2 includes a plurality of second semiconductor chips CP2. The method of manufacturing the second semiconductor wafer SW2 can be adopted from a known method as a method of manufacturing a semiconductor wafer having a transistor. The second semiconductor wafer SW2 is formed by forming a transistor Tr on the semiconductor substrate SUB and then forming a second multilayer wiring layer on the semiconductor substrate SUB.

(3) Forming the Resin Layer RL

The resin layer RL is formed on the printed substrate PSB. The forming the resin layer RL includes (3-1) forming the first resin layer RL1, (3-2) forming the second optical waveguide OW2, (3-3) forming the reflective surface RS, (3-4) forming the second resin layer RL2, and (3-5) forming the reflection suppressing layer RSL.

(3-1) Forming the First Resin Layer RL1

Figure 12:
FIG. 12 is a cross-sectional view showing an exemplary step included in the method of manufacturing the semiconductor device according to the first embodiment.

First, as shown in FIG. 12, a first resin layer RL1 is formed on the printed substrate PSB. The first resin layer RL1 may be formed by providing the curable resin composition constituting the first resin layer RL1 on the printed substrate PSB and then curing the curable resin composition. The curable resin composition may be a thermosetting resin composition or a photocurable resin composition. The first resin layer RL1 is patterned into a predetermined shape.

(3-2) Forming the Second Optical Waveguide OW2

Figure 13:
FIG. 13 is a cross-sectional view showing an exemplary step included in the method of manufacturing the semiconductor device according to the first embodiment.

Next, as shown in FIG. 13, the second optical waveguide OW2 is formed on the first resin layer RL1. First, a resin layer for an optical waveguide is formed on the first resin layer RL1. The resin layer for an optical waveguide may be formed by providing a curable composition constituting the resin layer for an optical waveguide on the first resin layer RL1 and then curing the curable composition. The curable composition may be a thermosetting composition or a photocurable composition. Next, the resin layer for an optical waveguide may be patterned into a predetermined shape.

(3-3) Forming the Reflective Surface RS

Figure 14:
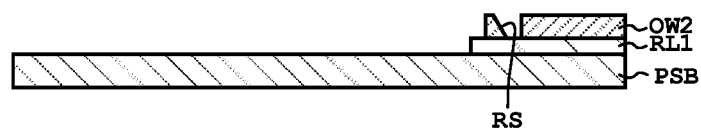
FIG. 14 is a cross-sectional view showing an exemplary step included in the method of manufacturing the semiconductor device according to the first embodiment.

Next, as shown in FIG. 14, the reflective surface RS is formed on a portion of the resin layer for an optical waveguide. First, as shown in FIG. 14, a notch is formed in a portion of the second optical waveguide OW2 by, for example, a dancing blade. As a result, one end surface of the second optical waveguide OW2 and an inclined surface facing the one end surface are formed. In the first embodiment, one end surface of the second optical waveguide OW2 is formed along a vertical line to the lower surface of the second optical waveguide OW2. The inclined surface of the resin layer for an optical waveguide is inclined relative to the vertical line to the surface of the second resin layer RL2.

Next, a metal film is formed on the inclined surface. As a result, the reflective surface RS can be formed on the resin layer for the optical waveguide, which is the base. The reflective surface RS faces with one end surface of the second optical waveguide OW2. The method of forming the metal film is, for example, a sputtering method.

(3-4) Forming the Second Resin Layer RL2

Figure 15:
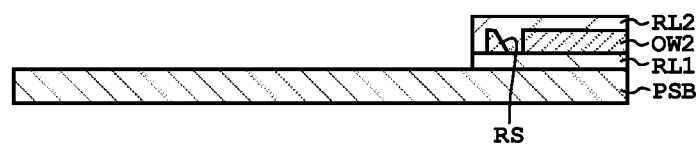
FIG. 15 is a cross-sectional view showing an exemplary step included in the method of manufacturing the semiconductor device according to the first embodiment.

Next, as shown in FIG. 15, the second resin layer RL2 is formed on the first resin layer RL1 so as to cover the second optical waveguide OW2 and the reflective surface RS. The method of forming the second resin layer RL2 is similar to the method of forming the first resin layer RL1. Next, the first resin layer RL1 and the second resin layer RL2 may be patterned into predetermined shapes.

(3-5) Forming the Reflection Suppressing Layer RSL

Figure 16:
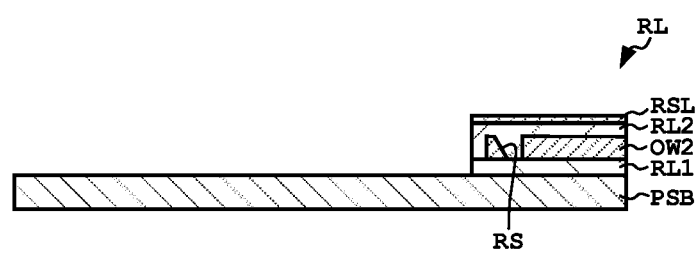
FIG. 16 is a cross-sectional view showing an exemplary step included in the method of manufacturing the semiconductor device according to the first embodiment.

Then, as shown in FIG. 16, a reflection suppressing layer RSL is formed on the second layer RL2. Examples of the method of forming the reflection suppressing layer RSL include a coating method and a laminating method.

(4) Assembling

Figure 17:
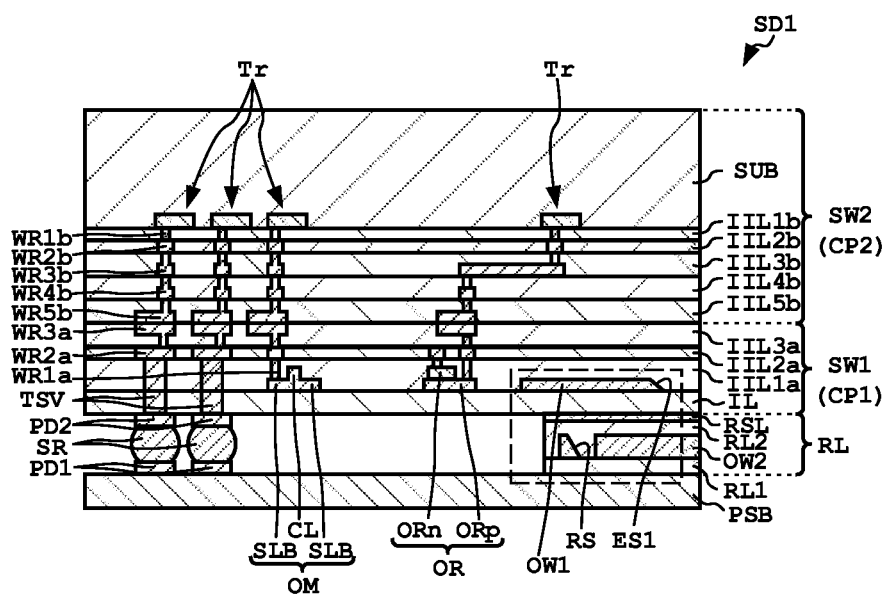
FIG. 17 is a cross-sectional view showing an exemplary step included in the method of manufacturing the semiconductor device according to the first embodiment.

Next, as shown in FIG. 17, the first semiconductor wafer SW1, the second semiconductor wafer SW2, and the printed substrate PSB on which the resin layers RL are formed are assembled.

First, the first semiconductor wafer SW1 chip CP1 and the second semiconductor wafer SW2 are laminated so that the wiring WR3a of the first semiconductor wafer SW1 and the wiring WR5b of the second semiconductor wafer SW2 are directly contacted with each other, thereby manufacturing a bonded wafer. Next, the laminated wafer is diced to form a singulated stack of the first semiconductor chip CP1 and the second semiconductor chip CP2.

Next, the stack of the first semiconductor chip CP1 and the second semiconductor chip CP2 is disposed on the printed substrate PSB singulated beforehand. In this instance, the first pad PD1 and the second pad PD2 are electrically connected by the solder ball SR. An optical axis is adjusted so that the light reflected by the end surface ES1 of the first optical waveguide OW1 is reflected by the reflective surface RS and enters the second optical waveguide OW2.

By the above manufacturing method, the semiconductor device SD1 according to the first embodiment can be manufactured. The method of manufacturing the semiconductor device SD1 according to the first embodiment may further include other steps as required. Examples of other steps include, for example, disposing a laser diode as a light source. The other steps may be suitably adopted from the methods known in the silicon photonics technology.

In addition, although the assembling is performed after the resin layer RL is formed, the method of manufacturing the semiconductor device according to the first embodiment is not limited. For example, the curable resin composition may be cured after the optical axis is adjusted while the curable resin composition for forming the second resin layer RL2 is filled between the first semiconductor chip CP1 and the first resin layer RL1. Thus, the forming the resin layer RL and the assembling the first semiconductor chip CP1 and the resin layer RL can be performed in the same step.

In the assembling step, after assembling the first semiconductor wafer SW1, the second semiconductor wafer SW2, and the printed substrate PSB on which the resin layer RL is formed, dicing of the first semiconductor wafer SW1, the second semiconductor wafer SW2 and the printed substrate PSB may be performed. This also provides a plurality of semiconductor device SD1 that are singulated.

(Effect)

The semiconductor device SD1 according to the first embodiment includes the first optical waveguide OW1 whose end reflective surface RS is inclined relative to the upper surface of the insulating layer IL. As a result, in the semiconductor device SD1, the light traveling in the first optical waveguide OW1 can be emitted to the outside of the first optical waveguide OW1 toward the insulating layer IL. As a result, light can be outputted from the first optical waveguide OW1 while suppressing optical losses. As a result, the characteristics of the semiconductor device SD1 can be enhanced in the first embodiment.

First Modification

Figure 18:
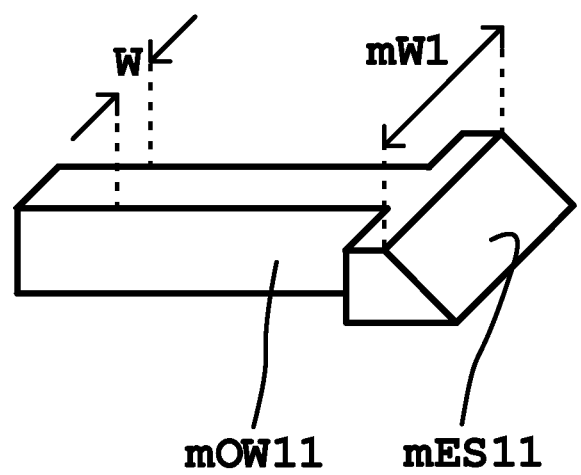
FIG. 18 is an enlarged perspective view showing an exemplary configuration of a first optical waveguide according to a first modification of the first embodiment.

FIG. 18 is an enlarged perspective view showing an exemplary configuration of the first optical waveguide mOW11 according to a first modification of the first embodiment. As shown in FIG. 18, the width mW1 of an end portion (end surface mES11) of the first optical waveguide mOW11 according to the first modification is greater than the width W of the first optical waveguide mOW11 other than the end portion. A difference between the width mW1 and the width W is preferably 200 nm or more, and 500 nm or less. This enables precise machining of the end face mES11. As a result, it is possible to reduce light losses when the light is reflected by the end surface mES11.

Second Modification

Figure 19:
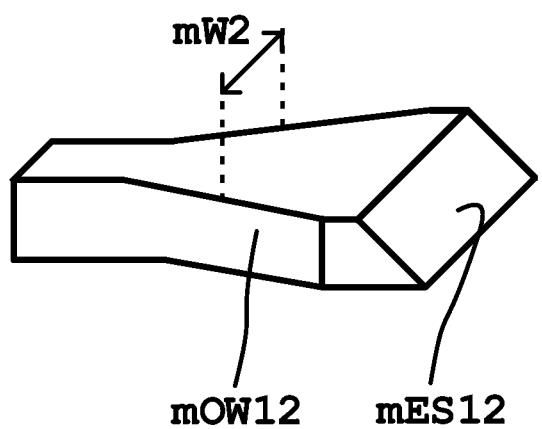
FIG. 19 is an enlarged perspective view showing an exemplary configuration of a first optical waveguide according to a second modification of the first embodiment.

FIG. 19 is an enlarged perspective view showing an exemplary configuration of the first optical waveguide mOW12 according to the second modification of the first embodiment. As shown in FIG. 19, the width mW2 of the first optical waveguide mOW12 according to the second modification continuously increases as it closer to the end surface mES12 of the first optical waveguide mOW12. As a result, the propagation modes of light can be converted while the propagation loss of light is suppressed at the end portion of the first optical waveguide mWO12.

Third Modification

Figure 20:
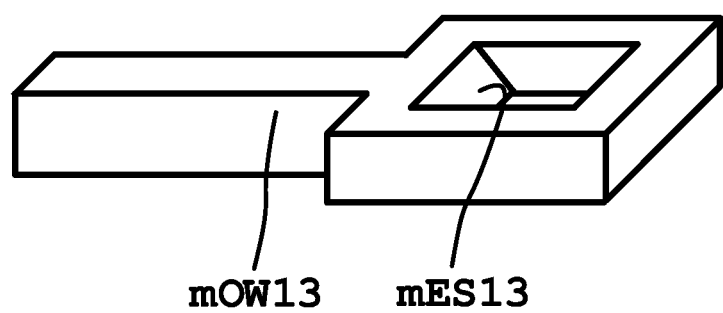
FIG. 20 is an enlarged perspective view showing an exemplary configuration of a first optical waveguide according to a third modification of the first embodiment.

FIG. 20 is an enlarged perspective view showing an exemplary configuration of the first optical waveguide mOW13 according to the third modification of the first embodiment. As shown in FIG. 20, the shape in plan view of the end portion of the first optical waveguide mOW13 according to the third modification is an annular shape. As a result, when the semiconductor layer SL constituting the first optical waveguide mOW3 is processed, the end portion of the first optical waveguide mOW3 having an annular shape functions as a stopper, so that the processing of the end surface mES13 of the first optical waveguide mOW13 can be performed more stably. In the third modification, the end surface mES13 is a portion of an inner surface of the end portion having an annular form. The end portion of the first optical waveguide mOW13 may not have a closed ring shape, but may have a notched portion.

Fourth Modification

Figure 21:
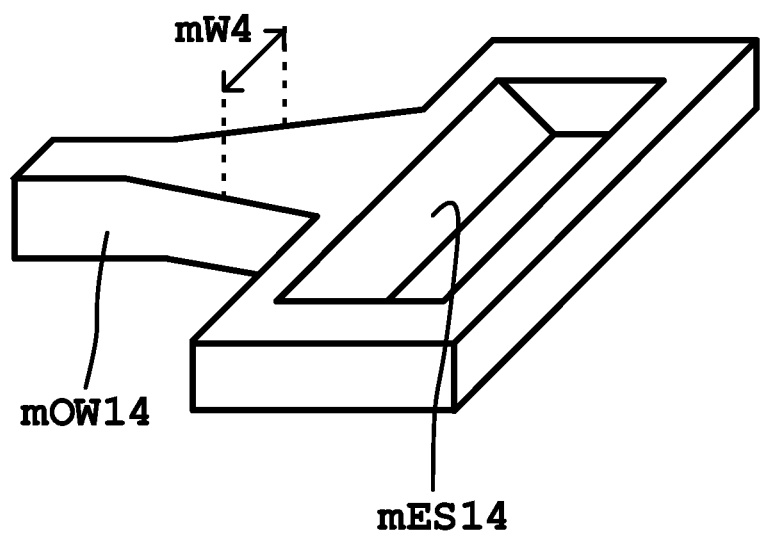
FIG. 21 is an enlarged perspective view showing an exemplary configuration of a first optical waveguide according to a fourth modification of the first embodiment.

FIG. 21 is an enlarged perspective view showing an exemplary configuration of the first optical waveguide mOW14 according to the fourth modification of the first embodiment. As shown in FIG. 21, the shape in plan view of an end portion of the first optical waveguide mOW14 according to the fourth modification is an annular shape, and the width mW4 of an end surface mES14 of the first optical waveguide mOW14 continuously increases as it closer to the end surface mES14 of the first optical waveguide mOW14. As a result, the processing of the end surface mES14 of the first optical waveguide mOW14 can be performed more stably, and the propagation modes of light can be converted while the propagation loss of light is suppressed in the end portion of the first optical waveguide mWO14.

Fifth Modification

Figure 22:
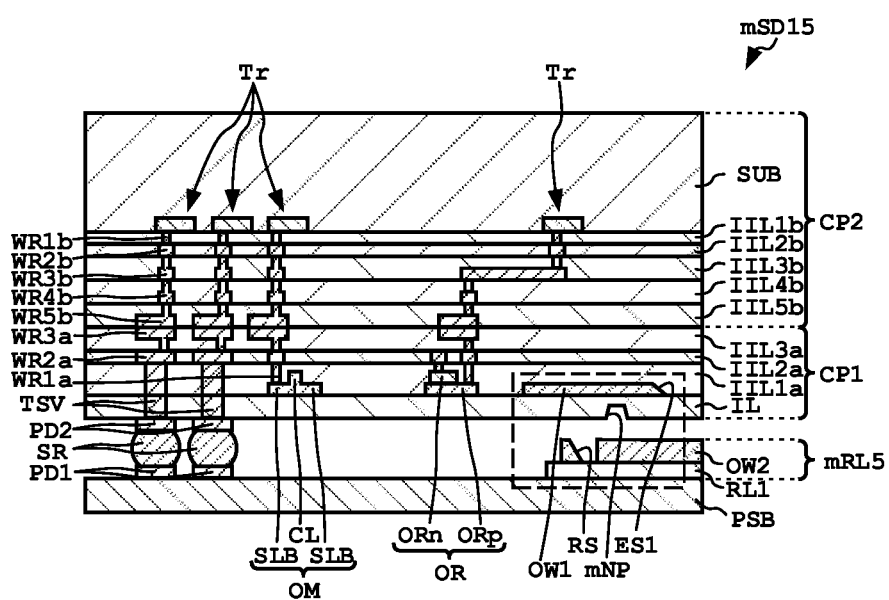
FIG. 22 is a cross-sectional view showing an exemplary configuration of a main portion of a semiconductor device according to the fifth modification of the first embodiment.

FIG. 22 is a cross-sectional view showing an exemplary configuration of a main portion of a semiconductor device mSD15 according to the fifth modification of the first embodiment. As shown in FIG. 22, in the semiconductor device mSD15 according to the fifth modification, a resin layer mRL5 includes the first resin layer RL1, the reflective surface RS, and the second optical waveguide OW2, and does not include the second resin layer RL2 and the reflection suppressing layer RSL.

In addition, from the viewpoint of adjusting the optical axis, a notch portion mNP may be formed in a portion of the back surface of the insulating layer IL located on the optical path. The shape and size of the notch portion mNP can be appropriately adjusted so that the reflected light from the end surface ES1 of the first optical waveguide OW1 can reach the reflective surface RS. The method of forming the notch portion mNP is, for example, dicing.

In the fifth modification, since the reflected light from the end surface ES1 of the first optical waveguide OW1 does not pass through the resin layer until the resin layer reaches the reflective surface RS, the propagation loss of the light can be reduced. In addition, since the optical axis can be arbitrarily adjusted in accordance with the shapes and sizes of the notch portion mNP, the degree of freedom in designing is increased and the manufacturing costs of the semiconductor device mSD15 can be reduced.

Second Embodiment

In a semiconductor device SD2 according to a second embodiment, the end surface ES1 of the first optical waveguide OW1 reflects the light in the first optical waveguide OW1 downward. In the semiconductor device SD2 according to the second embodiment, the first semiconductor chip CP1 including the first optical waveguide OW1 is formed separately from the second semiconductor chip including the transistor.

In the optoelectronic hybrid device LE2 (see FIG. 1) and the semiconductor device SD2 (see FIG. 23) according to the second embodiment, only the configuration of the first semiconductor chip CP21 in the semiconductor device SD2 differs from the optoelectronic hybrid device LE1 and the semiconductor device SD1 according to the first embodiment. Therefore, the same or corresponding elements as those of the optoelectronic hybrid device LE1 and the semiconductor device SD1 relating to the first embodiment are denoted by the same reference numerals, and descriptions thereof are omitted.

(Circuit Configuration of the Optoelectronic Hybrid Device)

FIG. 1 is a block diagram showing an exemplary circuit configuration of the optoelectronic hybrid device LE2 according to the second embodiment. As shown in FIG. 1, the optoelectronic hybrid device LE2 includes a first electronic circuit EC1, a semiconductor device SD2 and a light source LS. The semiconductor device SD2 according to the second embodiment includes a first semiconductor chip CP21 and a second semiconductor chip CP2. The first semiconductor chip CP21 includes an optical waveguide OW, an optical modulator OM, a light output part LO, a light input part LI, and an optical receiver OR.

(Configuration of the Semiconductor Device)

Figure 23:
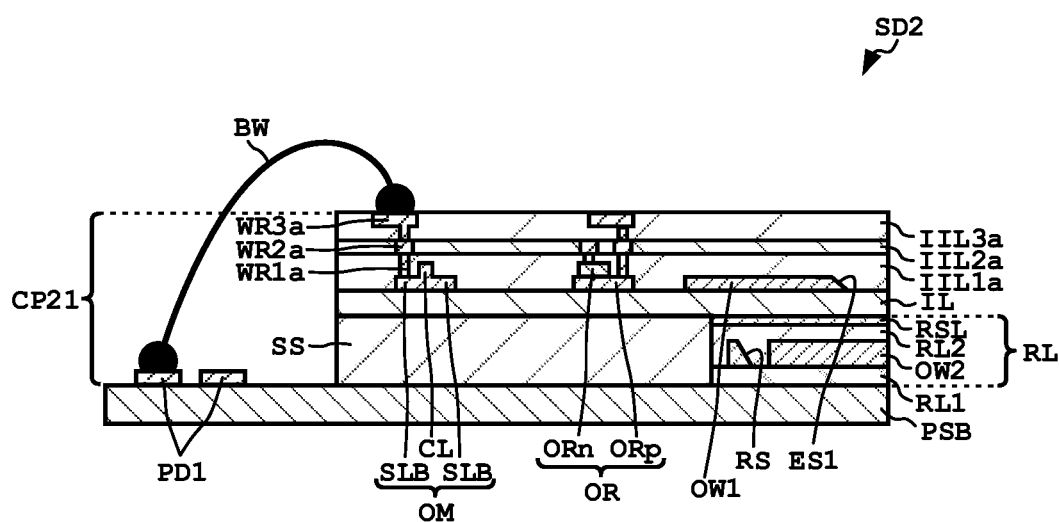
FIG. 23 is a cross-sectional view showing a main portion of a semiconductor device according to a second embodiment.

Next, the configuration of the semiconductor device SD2 according to the second embodiment will be described. FIG. 23 is a cross-sectional view showing a main portion of the semiconductor device SD2. In FIG. 23, the second semiconductor chip CP2 is omitted.

As shown in FIG. 23, the semiconductor device SD2 includes a printed substrate PSB, a first semiconductor chip CP21, a second semiconductor chip CP2 (not shown), and a resin layer RL.

The first semiconductor chip CP21 is disposed on the printed substrate PSB. As shown in FIG. 23, the first semiconductor chip CP21 includes a semiconductor substrate SS, an insulating layer IL, a first optical waveguide OW1, an optical modulator OM, an optical receiver OR, and a first multilayer wiring layer. In the second embodiment, the first semiconductor chip CP21 is electrically coupled with the printed substrate PSB via a bonding wire BW. In this instance, the bonding wire BW connects the wiring WR3a and the first pads PD1 with each other.

The semiconductor substrate SS supports the insulating layer IL together with the resin layer RL. A material constituting the semiconductor substrate SS is, for example, silicone. The semiconductor substrate SS is, for example, a monocrystalline silicon substrate containing impurities such as boron (B) and phosphorus (P). For example, the plane orientation of the main surface of the semiconductor substrate SS is (100), and the resistivity of the semiconductor substrate SS is 5 Ω·cm or more, and 50 Ω·cm or less. A thickness of the semiconductor substrate SS is, for example, 100 μm or more, and 900 μm or less.

(Method of Manufacturing the Semiconductor Device)

Next, an exemplary method of manufacturing the semiconductor device SD2 according to the second embodiment will be described. The method of manufacturing the semiconductor device SD2 according to the second embodiment differs from the method of manufacturing the semiconductor device SD1 according to the first embodiment only in the manufacturing the first semiconductor chip CP21. Therefore, only the difference from the semiconductor device SD1 according to the first embodiment will be described.

The method of manufacturing the semiconductor device SD2 according to the second embodiment includes manufacturing the first semiconductor chip CP21, manufacturing the second semiconductor chip CP2, forming the resin layer RL, and assembling.

The manufacturing the first semiconductor chip CP21 includes (1-1) providing the wafer SW (see FIG. 5), (1-2) forming the optical elements (see FIG. 6), (1-3) processing the end portion of the first optical waveguide OW1 (see FIG. 7), (1-4) forming the first multilayer wiring layer (see FIG. 8), and (1-5) removing the semiconductor substrate SS.

In the method of manufacturing the semiconductor device SD2 according to the second embodiment, as shown in FIG. 23, a portion of the semiconductor substrate SS is removed. Specifically, a portion of the semiconductor substrate SS where the resin layer RL is disposed is removed.

In the assembling in the second embodiment, the resin layer RL is disposed in a portion where the semiconductor substrate SS is removed. The first semiconductor chip SD21 and the printed substrate PSB are electrically coupled with each other via a bonding wire BW.

(Effect)

The semiconductor device SD2 according to second embodiment also exhibits the same effect as the semiconductor device SD1 according to first embodiment. In the semiconductor device SD2 according to the second embodiment, it is possible to suppress the effect of optical dispersions in the first semiconductor chip CP1 caused by heat generation in the second semiconductor chip CP2. As a result, losses can be reduced and the semiconductor device SD2 can be made thinner.

Third Embodiment

Figure 24:
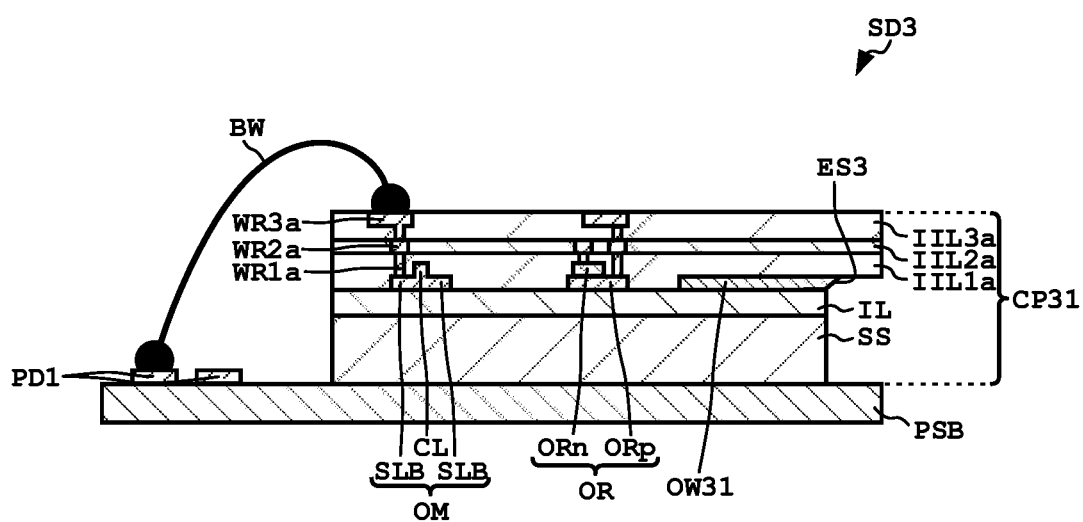
FIG. 24 is a cross-sectional view showing a main portion of a semiconductor device according to a third embodiment.

In a semiconductor device SD3 of a third embodiment shown in FIG. 24, an end surface ES3 of a first optical waveguide OW31 reflects the light in the first optical waveguide OW31 upward. In the semiconductor device SD3 according to the third embodiment, the first semiconductor chip CP31 including the first optical waveguide OW31 is formed separately from the second semiconductor chip including the transistor.

The optoelectronic hybrid device LE3 (see FIG. 1) and the semiconductor device SD3 according to the third embodiment differ from the optoelectronic hybrid device LE2 and the semiconductor device SD2 according to the second embodiment in that the semiconductor device SD3 does not include the resin layer RL and the configuration of the first semiconductor chip CP31. Therefore, the same or corresponding elements as those of the optoelectronic hybrid device LE2 and the semiconductor device SD2 according to the second embodiment are denoted by the same reference numerals, and their descriptions are omitted.

(Circuit Configuration of the Optoelectronic Hybrid Device)

FIG. 1 is a block diagram showing an exemplary circuit configuration of the optoelectronic hybrid device LE3 according to the third embodiment. As shown in FIG. 1, the optoelectronic hybrid device LE3 includes a first electronic circuit EC1, a semiconductor device SD3 and a light source LS. The semiconductor device SD3 according to the third embodiment includes a first semiconductor chip CP31 and a second semiconductor chip CP2. The first semiconductor chip CP31 includes an optical waveguide OW, an optical modulator OM, a light output part LO, a light input part LI, and an optical receiver OR.

(Configuration of the Semiconductor Device)

Next, the configuration of the semiconductor device SD3 according to the third embodiment will be described. FIG. 24 is a cross-sectional view showing a main portion of the semiconductor device SD3. In FIG. 24, the second chip CP2 is omitted.

As shown in FIG. 24, the semiconductor device SD3 includes a printed substrate PSB, a first semiconductor chip CP31, and a second semiconductor chip CP2 (not shown).

The first semiconductor chip CP31 is disposed on the printed substrate PSB. As shown in FIG. 24, the first semiconductor chip CP31 includes a semiconductor substrate SS, an insulating layer IL, a first optical waveguide OW31, an optical modulator OM, an optical receiver OR, and a first multilayer wiring layer.

The first optical waveguide OW31 is a path through which light can propagate (travel). The first optical waveguide OW31 is formed on the insulating layer IL. For example, the first optical waveguide OW31 has a width of 300 nm or more, and 500 nm or less, and a thickness of 200 nm or more, and 300 nm or less. The cross-sectional shape of the first optical waveguide OW1 is a rectangular shape or a trapezoidal shape. As described above, examples of a material of the first optical waveguide OW31 include silicon (Si) and germanium (Ge). Examples of a crystal structure of the material of the first optical waveguide OW31 include single crystal and polycrystalline. From the viewpoint of reducing light propagating losses in optical elements, the crystal structures of the material of the first optical waveguide OW31 are preferably single crystal.

The end surface ES3 of the first optical waveguide OW31 is inclined relative to an upper surface of the insulating layer IL. The end surface ES3 of the first optical waveguide OW31 is an end surface that connects an upper surface, the lower surface, and both side surfaces of the first optical waveguide OW31 with each other at an end portion of the first optical waveguide OW31.

An angle formed by the lower surface of the first optical waveguide OW31 and the end surface ES3 is greater than an angle formed by the lower surface and the side surface of the first optical waveguide OW31. Thus, the end surface ES3 of the first optical waveguide OW31 can reflect the light reaching the end portion of the first optical waveguide OW31 upward. In other words, the end surface ES3 of the first optical waveguide OW31 can reflect the light reaching the end portion of the first optical waveguide OW31 toward the first multilayer wiring layer. The angle formed by the lower surface of the first optical waveguide OW31 and the end surface ES3 is greater more than 90° and less than 180°, and preferably 125° or more, and 145° or less.

The crystallographic plane of the end surface ES3 is not particularly limited, and can be appropriately adjusted according to a method of forming the end face ES3. The crystallographic plane of the end surface ES3 is, for example, a (111) plane. The crystallographic plane of an upper surface of the first optical waveguide OW31 is a (100) plane.

A width of the end portion (end surface) of the first optical waveguide OW31 may be similar to or different from a width of a portion of the first optical waveguide OW31 other than the end portion. The width of the end portion of the first optical waveguide OW31 may be smaller or greater than the width of the portion of the first optical waveguide OW31 other than the end portion. In the third embodiment, the width of the end portion of the first optical waveguide OW31 is substantially the same as the width of the portion of the first optical waveguide OW31 other than the end portion.

(Method of Manufacturing the Semiconductor Device)

Next, an exemplary method of manufacturing the semiconductor device SD3 according to the third embodiment will be described. The method of manufacturing the semiconductor device SD3 according to the third embodiment differs from the method of manufacturing the semiconductor device SD2 according to the second embodiment only in the forming the first semiconductor chip CP31. Therefore, only the difference from the method of manufacturing the semiconductor device SD2 according to the second embodiment will be described.

FIG. 25 to FIG. 28 are cross-sectional view showing exemplary steps included in the method of manufacturing the semiconductor device SD3.

The forming the first semiconductor chip CP31 includes (1-1) providing the wafer SW (see FIG. 5), (1-2) forming the optical elements (see FIG. 6), (1-3) forming the first multilayer wiring layer, (1-4) removing the semiconductor substrate SS and the insulating layer IL, and (1-5) processing the end portion of the first optical waveguide OW31.

Figure 25:
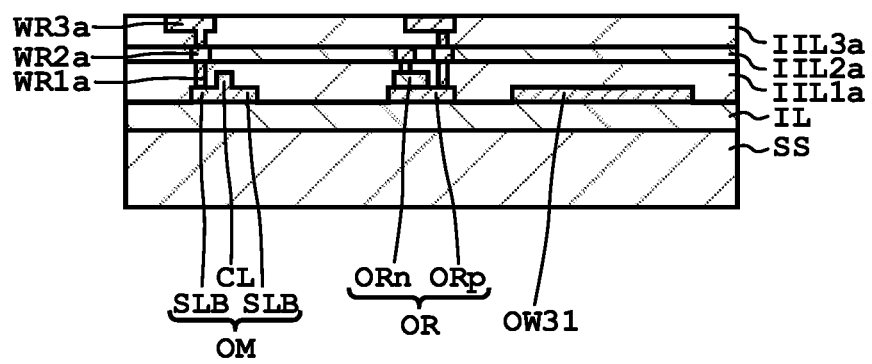
FIG. 25 is a cross-sectional view showing an exemplary step included in the method of manufacturing the semiconductor device according to the third embodiment.

As shown in FIG. 25, a first multilayer wiring layer is formed on the insulating layer IL so as to cover the first optical waveguide OW31, the optical modulator OM and the optical receiver OR.

Figure 26:
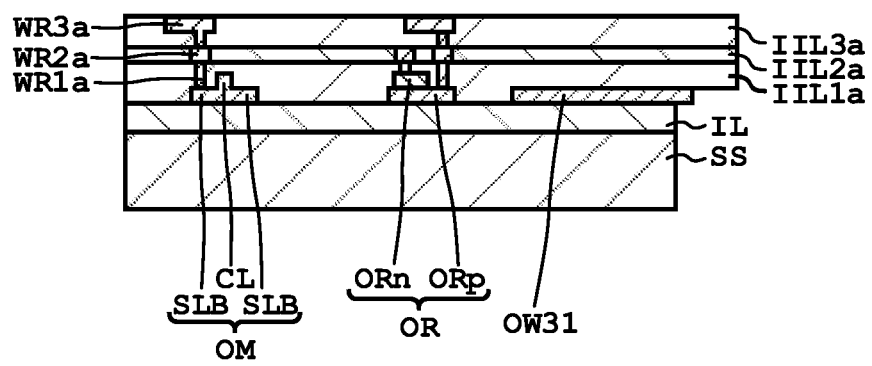
FIG. 26 is a cross-sectional view showing an exemplary step included in the method of manufacturing the semiconductor device according to the third embodiment.

(1-4) Removing the semiconductor substrate SS and the insulating layer IL Next a portion of the semiconductor substrate SS and a portion of the insulating layer IL are removed, as shown in FIG. 26. More specifically, portions of the semiconductor substrate SS and the insulating layer IL located directly below the end portion of the first optical waveguide OW31 is removed. A method of removing semiconductor substrate SS and insulating layer IL is, for example, a dry etch method. At this time, a portion of the interlayer insulating layer IIL1a may or may not be removed.

(1-5) Processing the End Portion of the First Optical Waveguide OW31

Figure 27:
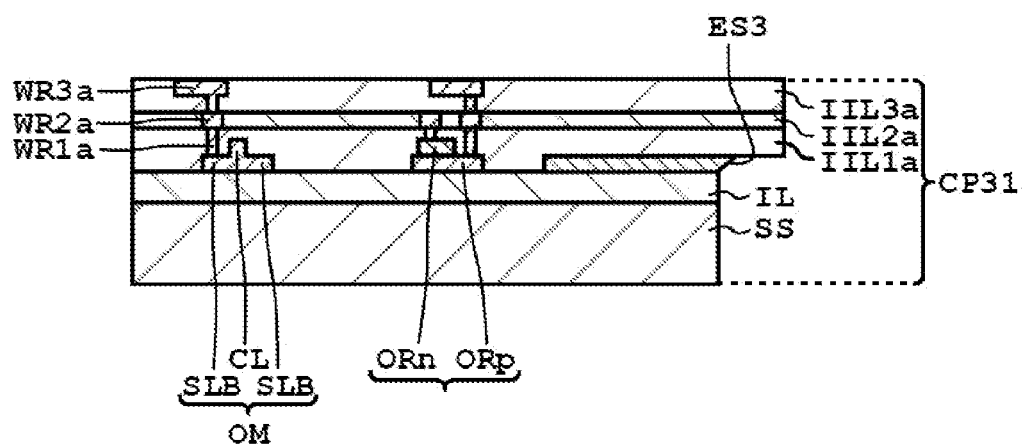
FIG. 27 is a cross-sectional view showing an exemplary step included in the method of manufacturing the semiconductor device according to the third embodiment.

Next, as shown in FIG. 27, the end portion of the first optical waveguide OW1 is processed so that the end surface ES1 of the first optical waveguide OP1 is inclined relative to an upper surface of the insulating layer IL. For example, the end portion of the first optical waveguide OW31 may be processed by a wet etching method or may be processed by a dry etching method.

Through these processes, the first semiconductor chip CP31 is formed.

Figure 28:
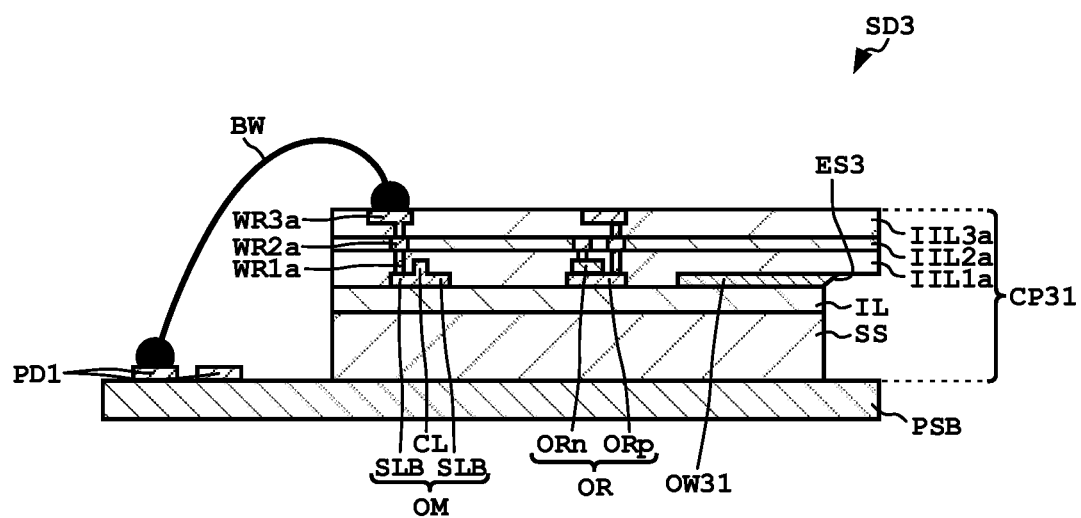
FIG. 28 is a cross-sectional view showing an exemplary step included in the method of manufacturing the semiconductor device according to the third embodiment.

Finally, as shown in FIG. 28, the semiconductor device SD3 according to the third embodiment is manufactured by the assembling.

(Effect)

The semiconductor device SD3 according to the third embodiment also exhibits the same effect as the semiconductor device SD2 according to the second embodiment. In the semiconductor device SD3 according to the third embodiment, a reflected light from the end surface ES3 of the first optical waveguide OW31 can be guided upward.

It should be noted that the present invention is not limited to the above-mentioned embodiments, and various modifications can be made without departing from the gist thereof. Further, at least a part of each embodiment and each modification may be arbitrarily combined with each other.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

What is claimed is:

1. A semiconductor device comprising:
a printed substrate;
a cladding layer;
a resin layer formed between the printed substrate and the cladding layer;
a first optical waveguide formed on the cladding layer; and
a second optical waveguide formed in the resin layer,
wherein an end surface of the first optical waveguide is inclined relative to a vertical line perpendicular to an upper surface of the cladding layer, and
wherein the second optical waveguide is configured to propagate light reflected at the end surface of the first optical waveguide.

2. The semiconductor device according to claim 1, wherein an angle formed by the end surface of the first optical waveguide and a lower surface of the first optical waveguide is more than 0° and less than 90°.

3. The semiconductor device according to claim 2, wherein the angle formed by the end surface of the first optical waveguide and the lower surface of the first optical waveguide is 35° or more, and 55° or less.

4. The semiconductor device according to claim 1, wherein an angle formed by the end surface of the first optical waveguide and a lower surface of the first optical waveguide is more than 90°, and less than 180°.

5. The semiconductor device according to claim 4, wherein the angle formed by the end surface of the first optical waveguide and the lower surface of the first optical waveguide is 125° or more, and 145° or less.

6. The semiconductor device according to claim 1, wherein a width of an end portion of the first optical waveguide is greater than a width of a portion of the first optical waveguide other than the end portion.

7. The semiconductor device according to claim 6, wherein a width of the first optical waveguide continuously increases toward the end surface.

8. The semiconductor device according to claim 1,
wherein a material of the first optical waveguide is silicon, and
wherein a material of the cladding layer is silicon oxide.

9. The semiconductor device according to claim 1, comprising a reflective surface configured to reflect light reflected at the end surface of the first optical waveguide toward the second optical waveguide.

10. The semiconductor device according to claim 1, wherein a material of the second optical waveguide is resin.

11. The semiconductor device according to claim 9, wherein a material of the reflective surface is metal.

12. The semiconductor device according to claim 1, wherein a notch portion is formed in a portion of a back surface of the cladding layer located on an optical path.

\* \* \* \* \*